(12) United States Patent
Levine

(10) Patent No.: US 8,072,776 B2
(45) Date of Patent: Dec. 6, 2011

(54) PRESSURE-COMPENSATED ENCLOSURE

(75) Inventor: Donald L. Levine, Oswego, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 595 days.

(21) Appl. No.: 12/271,569

(22) Filed: Nov. 14, 2008

(65) Prior Publication Data

US 2010/0124032 A1    May 20, 2010

(51) Int. Cl.
*H05K 5/06* (2006.01)
(52) U.S. Cl. ........ 361/797; 361/796; 361/730; 361/752; 174/50.5
(58) Field of Classification Search .......... 361/730, 361/752, 796, 797; 174/50, 50.5
See application file for complete search history.

(56) References Cited

U.S. PATENT DOCUMENTS

| | | | |
|---|---|---|---|
| 3,814,043 A | 6/1974 | Krout | |
| 4,003,620 A | 1/1977 | O'Brien et al. | |
| 4,411,434 A | 10/1983 | Lewis | |
| 4,858,764 A * | 8/1989 | Domokos | ...................... 206/449 |
| 5,884,706 A | 3/1999 | Edwards | |
| 7,400,510 B1 * | 7/2008 | Milligan et al. | .............. 361/752 |
| 2006/0152011 A1 | 7/2006 | Fraenkel | |

OTHER PUBLICATIONS

International Search Report dated Jan. 15, 2010 for related application PCT/US 09/64413.

* cited by examiner

*Primary Examiner* — Dameon Levi
(74) *Attorney, Agent, or Firm* — Howard IP Law Group, PC

(57) ABSTRACT

A pressure compensating enclosure comprises a sealed enclosure having substantially rigid outer walls and an interior cavity adapted to receive components to be protected by the enclosure. The sealed enclosure has an aperture in one of its outer walls which is sealingly coupled to a hollow, elastic member disposed in the enclosure so as to be in fluid communication with the exterior of the enclosure. An incompressible fluid substantially fills the sealed enclosure, wherein in response to a change in temperature of the enclosure, the volume occupied by the incompressible fluid changes and the hollow elastic member deforms responsive to the change in volume of the incompressible fluid sufficient to pressure balance the enclosure.

20 Claims, 5 Drawing Sheets

PRESSURE-COMPENSATED ENCLOSURE

FIELD OF INVENTION

The present invention is in the field of pressure-compensated electronic enclosures for maritime applications and particularly related to thermal expansion or contraction compensation elements for outboard electronics enclosures.

BACKGROUND

The design of pressure-compensated electronic enclosures for maritime applications is challenging due to the large range of thermal expansion and contraction and due to the extensive range of temperatures that these devices are required to operate within. For example, in many undersea applications, outboard electronics are typically packaged in a metallic enclosure to provide shelter from the surrounding seawater. One approach is the use of a pressure vessel which is typically filled with nitrogen or some other inert gas in order to avoid internal condensation. Since the gas within the enclosure is compressible, the enclosure walls have to be robust enough to withstand the external hydrostatic pressure. For this reason, pressure vessels tend to be heavy, expensive, and quite large relative to the size of the packaged electronics. Alternatives are desired.

SUMMARY OF THE INVENTION

In one embodiment of the invention, a pressure compensating enclosure comprises a sealed enclosure having substantially rigid outer walls and an interior cavity adapted to receive components to be protected by the enclosure. The sealed enclosure has an aperture in one of its outer walls which is sealingly coupled to a hollow, elastic member disposed in the enclosure so as to be in fluid communication with the exterior of the enclosure. An incompressible fluid substantially fills the sealed enclosure, wherein, in response to a change in temperature of the enclosure, the volume occupied by the incompressible fluid changes and the hollow elastic member deforms responsive to the change in volume of the incompressible fluid sufficient to pressure balance the enclosure.

In one embodiment of the invention, a pressure-compensated enclosure includes an enclosure filled with a substantially incompressible fill fluid. A generally elastic hollow element is securely positioned inside the enclosure and has at least one port opening outside the enclosure. The generally elastic hollow element is at least partially collapsed during an assembly state. Responsive to the expansion of the fill-fluid, the hollow element collapses further. Responsive to the contraction of the fill-fluid, the hollow element expands towards the at least partially collapsed state.

Another embodiment of the invention includes a method for pressure compensating a fluid-filled enclosure. The method includes a step of securing a generally elastic hollow element inside an enclosure such that the at least one port of the generally elastic hollow element opens outside the enclosure. The generally elastic hollow element is pre-collapsed from its initial natural state by filling the enclosure with a fill-fluid. The extent of pre-collapsing is determined based on the temperature of the fill-fluid at the time of the assembly and on the range of operating temperatures for the fill-fluid.

To address the problem of temperature-induced volume fluctuations of a fill fluid, one embodiment of the invention utilizes an elastic expansion tube. This design reshapes itself to handle volumetric changes without elongation of the elastomer. This allows the configuration to essentially maintain a state of zero pressure differential across walls of the housing. The tube is fully sealed within the rigid enclosure walls which in turn protect the tube from being damaged during assembly or operation. The tube can be of any shape and, in one configuration, is connected to the enclosure walls with one or more fittings that seal the tube to the enclosure. The fill fluid within the enclosure surrounds the outer portion of the tube while fluid, such as seawater when the enclosure is exposed in an aquatic environment is allowed to, at a given depth, flow within the tube.

As part of the assembly operations, a sufficient amount of fill fluid is added to partially collapse the tube based on the fill fluid temperature and the desired operating temperature range. In an operational environment, as the fill fluid heats and expands within the sealed enclosure, the tube approaches its fully collapsed state. As the fill fluid cools and contracts within the sealed enclosure, the tube expands as it approaches its natural shape. Increasing the size of the tube will allow for larger displacements and broader operating temperature ranges.

BRIEF DESCRIPTION OF THE DRAWINGS

Understanding of the present invention will be facilitated by consideration of the following detailed description of the exemplary embodiments of the present invention taken in conjunction with the accompanying drawings, in which like numerals refer to like parts and in which.

DETAILED DESCRIPTION

It is to be understood that the figures and descriptions of the present invention have been simplified to illustrate elements that are relevant for a clear understanding of the present invention, while eliminating, for purposes of clarity, many other elements found in typical pressure-compensated enclosures. However, because such elements are well known in the art, and because they do not facilitate a better understanding of the present invention, a discussion of such elements is not provided herein. The disclosure herein is directed to all such variations and modifications known to those skilled in the art.

Figure 1:
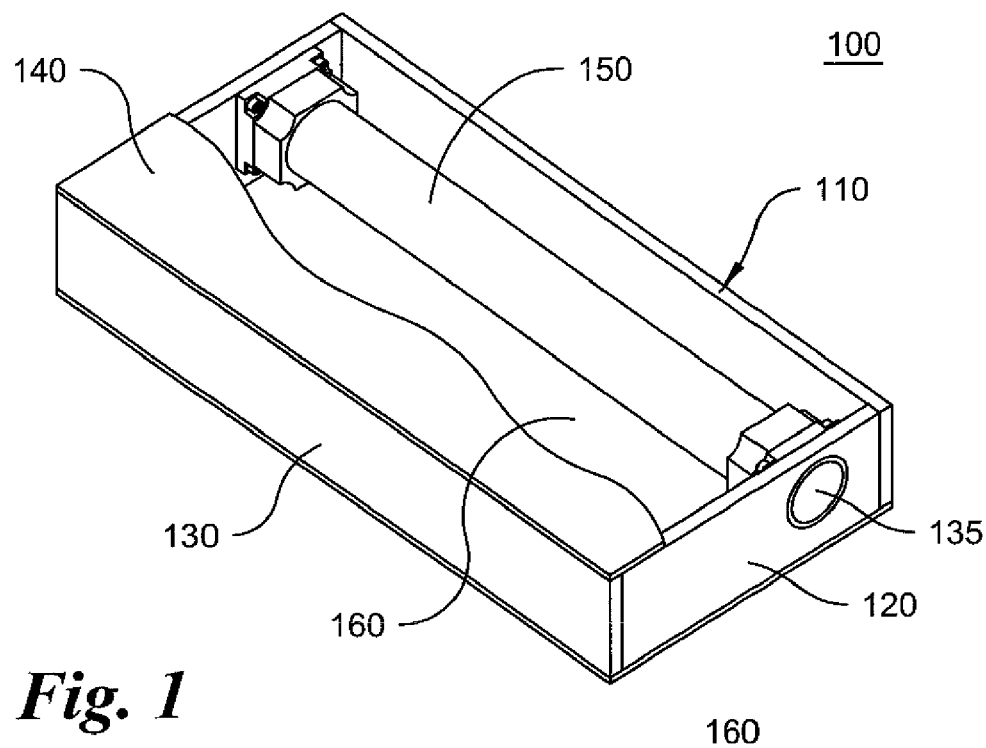
FIG. 1 is a perspective view of a pressure-compensated enclosure, according to an embodiment of the invention, with a top wall partially cut away.

Referring to FIG. 1, a pressure-compensated enclosure assembly 100 is illustrated. Pressure-compensated enclosure 100 includes a box-like structure 110 containing a pressure-compensating element 150. In the illustrated embodiment, enclosure 110 is formed from two oppositely disposed endwalls 120, two oppositely disposed sidewalls 130, and a top wall and a bottom wall 140. Each of the aforementioned walls is solid so as not to permit ingress or egress of material into or out of the interior of the enclosure. Each of the aforementioned walls is also sufficiently rigid to withstand pressure variations from the external environment, to which enclosure 100 is subjected. However, it is understood that one or more of enclosure walls 120, 130, 140 may be removable or openable to grant access to the interior of enclosure 110. In an exemplary embodiment, enclosure walls 120, 130, 140 may be made of a solid metal, for example, a stainless steel. Other metals and materials, which have sufficient mechanical strength and are resistant to corrosion, may also be used to construct enclosure 110. By way of non-limiting examples only, such metals may include titanium and aluminum.

Figure 6:
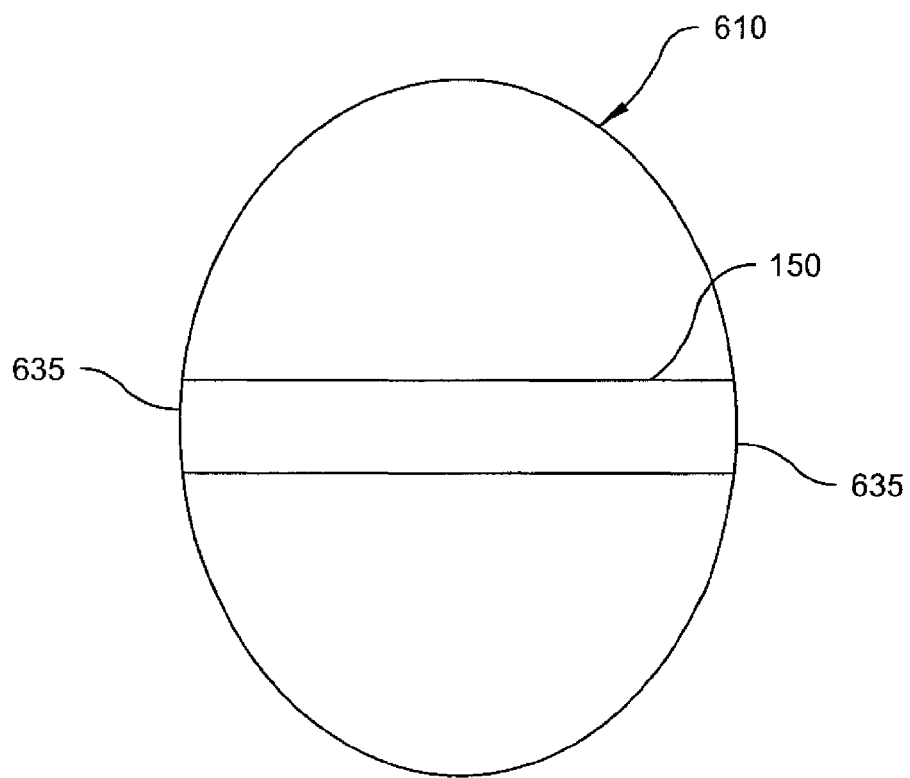
FIG. 6 illustrates a side view of another embodiment of enclosure, according to an aspect of the present invention.

Enclosure 110 may be located outboard on a sea-going vessel or in-board. Enclosure 110 may be subject to severe operating environments such as high external pressure and/or temperature, both of which may vary widely. Therefore, the walls of enclosure 110 are adapted to withstand high hydrostatic pressures in deep seawater and to resist chemical deterioration resulting from prolonged exposure to seawater. Enclosure 110 is filled with a substantially incompressible fill fluid 160. Incompressible fill fluid 160 assists enclosure 110 in resisting external pressure. In an exemplary embodiment, the dimensions of enclosure 110 may be 24 inches by 10 inches by 6 inches. Enclosures of other shapes and sizes are also possible in other embodiments of the present invention, depending on a particular application. By way of non-limiting example only, enclosure 610 may be spherical in terms of its outer wall structure, as shown in FIG. 6. Various applications may include housing electronics and mechanical components.

Still referring to FIG. 1, a pressure-compensating element 150, positioned inside enclosure 110, is a generally elastic hollow member having at least one port 135 opening outside enclosure 110. In the illustrated embodiment, pressure-compensating element 150 is a generally tubular member having a circular cross-section. In other embodiments, element 150 has an oval or curved cross-section. The illustrated embodiment has one element 150. Other embodiments may have more than one element 150 within the sealed enclosure 110. Element 150 may be made of, by way of non-limiting example only, an elastic polymeric material such as nitrile rubber or urethane. Other embodiments of the invention may include element 150 made up of any elastomeric material which is compatible with seawater or other surrounding fluid and with the fill-fluid. Such an elastomeric material is elastically deformable responsive to the pressure resulting from thermally induced volumetric changes in the fill fluid and is capable of enduring repeated cycles of such deformation. In the embodiment illustrated in FIG. 6, hollow element 150 has a configuration similar to that of FIG. 1, namely, having first and second open ports 635, opening outside enclosure 610 and adapted to be in fluid communication with an external fluid surrounding enclosure 610.

Figure 2:
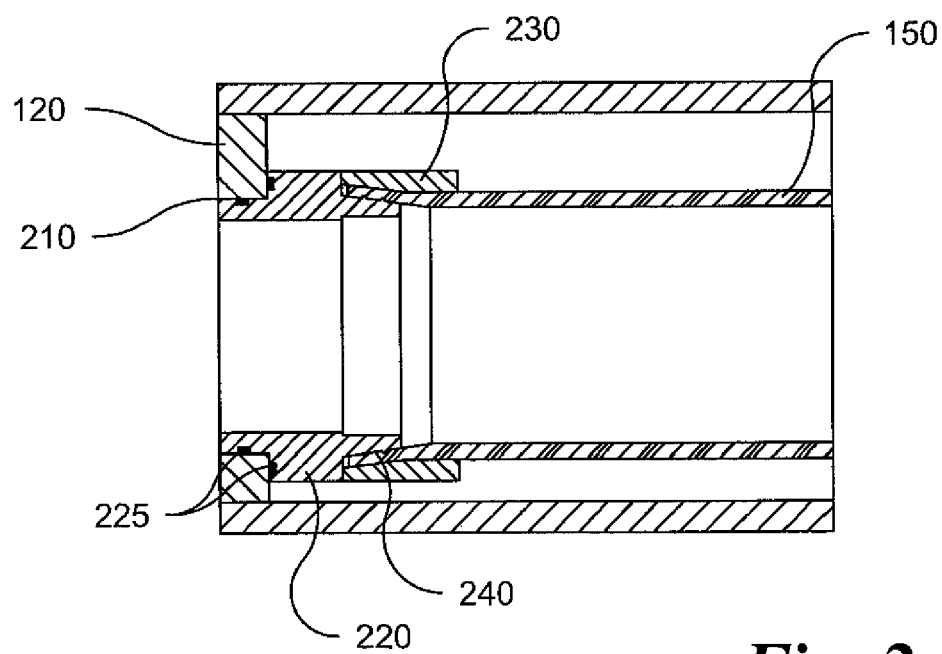
FIG. 2 is a partial cross-section view of a fitting arrangement for a pressure-compensating element positioned inside the enclosure of FIG. 1, according to an embodiment of the invention.

Referring now to FIG. 2, there is illustrated a fitting arrangement for pressure-compensating element 150 inside enclosure 110. Element 150 is positioned removably and replaceably inside enclosure 110. In an exemplary embodiment, wall 120 of enclosure 110 has an opening 210. A retention fitting 220 is positioned in opening 210 in an exemplary embodiment of the present invention. Two O-ring seals 225 are inserted between wall 120 and retention fitting 220.

Seals 225 operate to seal the interface between retention fitting 220 and wall 120 and to prevent the entry of outside fluid into enclosure 110 and the egress of fill fluid 160 from enclosure 110 through opening 210. Other means of sealing the interface may also be used and are thus not described in further detail for the sake of brevity. Element 150 is mounted on retention fitting 220 and is retained via a locking collar 230. In an exemplary embodiment, collar 230 may be a metallic locking collar. A gasket adhesive 240 may optionally be applied at the interface of element 150 and retention fitting 220 to assist in making the interface leakage-proof. The illustrated arrangement facilitates easy removal and replacement of element 150 from enclosure 110 while sealing the enclosure. In an exemplary embodiment, retention fittings 220 may be made of a metallic material. Retention fittings 220 may be made of the same material as that of enclosure 110. In another embodiment, retention fittings 220 may be integrally formed with enclosure walls 120 by casting or drawing.

Figure 3:
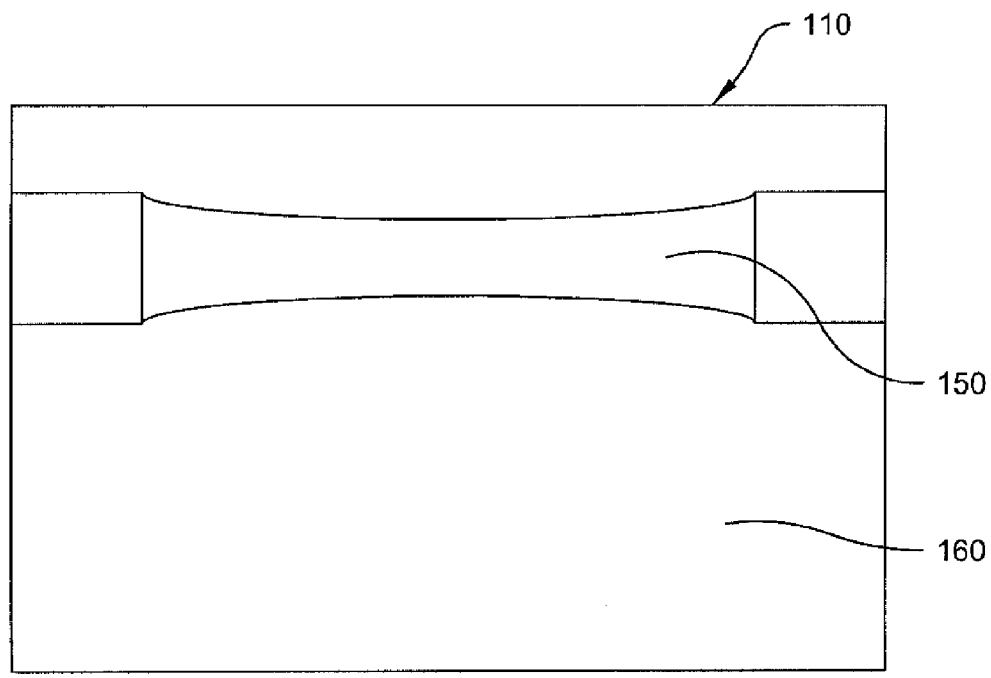
FIG. 3 illustrates a schematic top view of the enclosure of FIG. 1 immediately after an assembly stage wherein the pressure-compensating element is in a partially collapsed state, according to an aspect of the present invention.

Referring now to FIG. 3, there is illustrated a schematic top view of enclosure 110. Enclosure 110 is generally completely filled with fill fluid 160 at a given temperature and pressure. Fill fluid 160 causes a partial collapse or pre-compression of element 150 disposed therein. The extent of pre-compression or pre-collapsing of element 150 may be determined from the temperature of fluid 160 at the time of the filling and from the operating temperature range of fluid 160. A targeted pre-compression or pre-collapsing of element 150 may be achieved by placing temporary spacer rods (not shown) within interior space of element 150 during the assembly stage or the process of filling enclosure 110 with filling fluid 160. The extent of pre-compression or pre-collapsing is determined according to the formula:

$$n = m \times \left(\frac{c-a}{b-a}\right)$$

m=the maximum allowable compression or collapsing of element 150 without permanently damaging element 150;

n=the extent of pre-compression or pre-collapsing of element 150 during the assembly;

a=the minimum temperature to which fluid 160 is expected to be subjected to;

b=the maximum temperature to which fluid 160 is expected to be subjected to; and c=the temperature of fill fluid at the time of filling enclosure 110.

Fill fluid 160 may expand, for example, due to heating of the fluid caused by the heat of the electronic circuits (e.g. circuit boards) present in enclosure 110 or due to a rise in the temperature of the fluid as a result of heat transfer from the outer walls of enclosure 110, for example. Fill fluid 160 may contract, for example, due to a decrease in the temperature of the fluid contained in enclosure 110 for analogous reasons. If fill fluid 160 expands due to an increase in the temperature, element 150 collapses further to compensate for the expansion within the finite volume. If fill fluid 160 contracts due to a decrease in its temperature, element 150, being elastic in nature, tends to revert to its original partially collapsed state, thereby preventing the creation of a vacuum within enclosure 110. The creation of a vacuum inside enclosure 110 may lead to an implosion of enclosure 110 when subjected to high external pressure, such as a high hydrostatic pressure. An ambient fluid such as seawater may enter element 150 via aperture 130, thereby expanding element 150 towards its initial pre-collapsed state. If the volume of fill fluid 160 contracts more than its original volume, element 150 expands further to its natural state. Thus, element 150 generally does not expand beyond its natural state; thereby reducing stresses developed in element 150 and thus increasing the operating life of element 150. The size, length and number of elements 150 may be varied to achieve the desired level of volumetric and pressure compensation for a given enclosure 110.

Fill fluid 160, by way of non-limiting example only, may be a synthetic oil or any other electrically non-conductive fluid. In an exemplary embodiment, fluid 160 has a freezing point lower than the temperature of the external environment fluids, for example, seawater, in which enclosure 110 is expected to be submerged. The type of fill fluid 160 used may influence the selection of material for element 150. Element 150 is constructed of a material which is compatible with, or not adversely affected by, fluid 160. A factor in the selection of the fill fluid is the application for which enclosure 110 is utilized. If enclosure 110 houses electronics, then an electrically non-conductive and thermally conductive fill-fluid is used to facilitate efficient cooling of the electronics. If the application is a pump or other mechanical device, then water may be used as the fill fluid. In other embodiments, a mixture of two or more fluids may also be used, in which case each of the fluids is chosen to be compatible with the other fluids as well as with the materials of element 150 and enclosure 110, as well as the component(s) housed within enclosure 110. A mixture of fluids may include fluids having different viscosity or thermal expansion rates, if required by the application. In other embodiments, two fluids which are mutually insoluble may also be used, wherein the relatively denser fluid fills the bottom portion of enclosure 110, whereas the other fluid fills up the upper portion of enclosure 110. As is known in the art, it is possible that enclosure 110 may include some insignificant amount of air in form of air bubbles along with fluid 160. The presence of such air bubbles is generally harmless to the proper functioning of enclosure 110 and pressure-compensating element 150.

An advantage of the pressure-compensating element 150 is that element 150 has at least one port 135 opening outside enclosure 110. When enclosure 110 is submerged in sea, for example, seawater enters element 150. When fluid 160 expands and element 150 collapses, seawater is pushed out of element 150. On the other hand, when fluid 160 contracts, there is a reduction in pressure inside enclosure 110 which is balanced by hydrostatic pressure of sea-water rushing into element 150 thereby aiding in the expansion of element 150 from its collapsed state towards its pre-collapsed state or its natural state depending on the extent of the contraction of fluid 160.

A further advantage of the present invention is that the pressure-compensating element 150 is completely covered by enclosure 110. This reduces the risk of damage to pressure-compensating element 150 during storage and handling as well as during operation.

Figure 4:
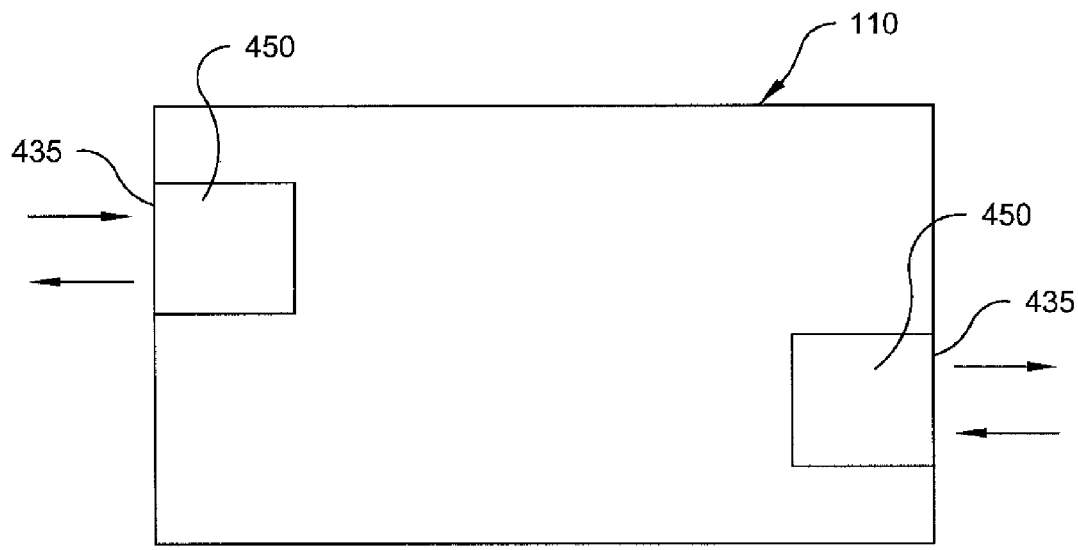
FIG. 4 illustrates a top view of another embodiment of the pressure-compensated enclosure, according to an aspect of the present invention.
Figure 5:
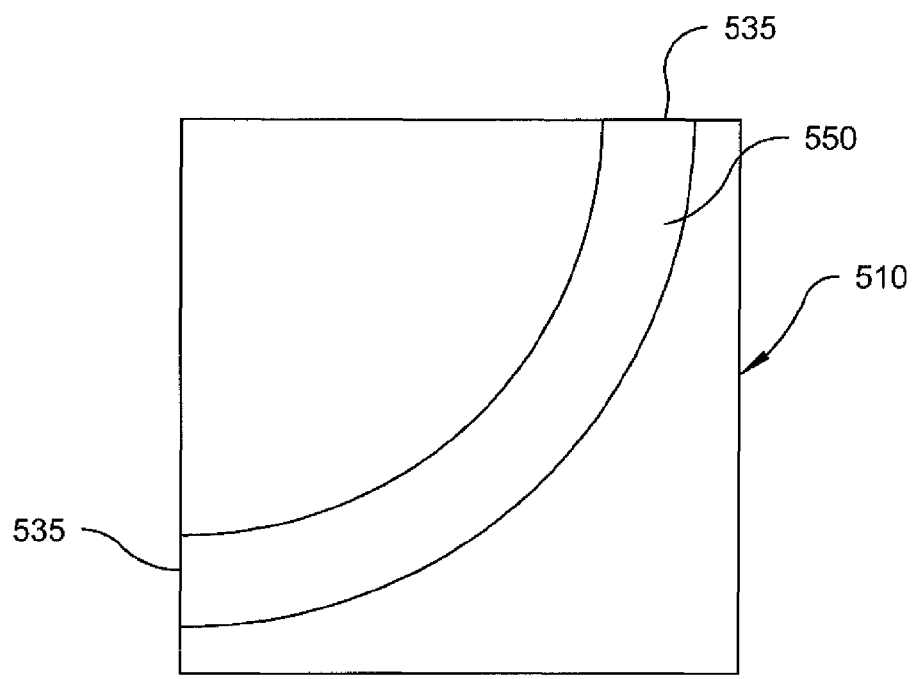
FIG. 5 illustrates a top view of yet another embodiment of the pressure-compensated enclosure, according to an aspect of the present invention.

Referring now to FIG. 4, there is illustrated another exemplary embodiment of enclosure 110. Enclosure 110 has two pressure-compensating elements 450. Each pressure-compensating 450 is a generally elastic hollow element having a port 435 opening outside enclosure 110. Depending on the temperature of fill fluid 160 inside enclosure 110, elements 450 contract and expand, thereby pressure-compensating enclosure 110. Yet another embodiment of the present invention is illustrated in FIG. 5 wherein a curved pressure-compensating element 550 has port openings 535 opening outside enclosure 510, through adjacent walls of enclosure 510.

Another aspect of the present invention is a method for pressure compensating a fluid-filled enclosure. At block 710, a generally elastic hollow element 150 (of FIG. 1) is secured inside an enclosure 110 (of FIG. 1). Depending on the temperature of the fill-fluid at the time of the assembly, and on the expected range of operating temperatures, the extent of pre-collapsing is determined for generally elastic hollow element 150 (of FIG. 1). The fill-fluid is filled in enclosure 110 (of FIG. 1) thereby collapsing element 150 (of FIG. 1) to a predetermined extent.

Figure 7:
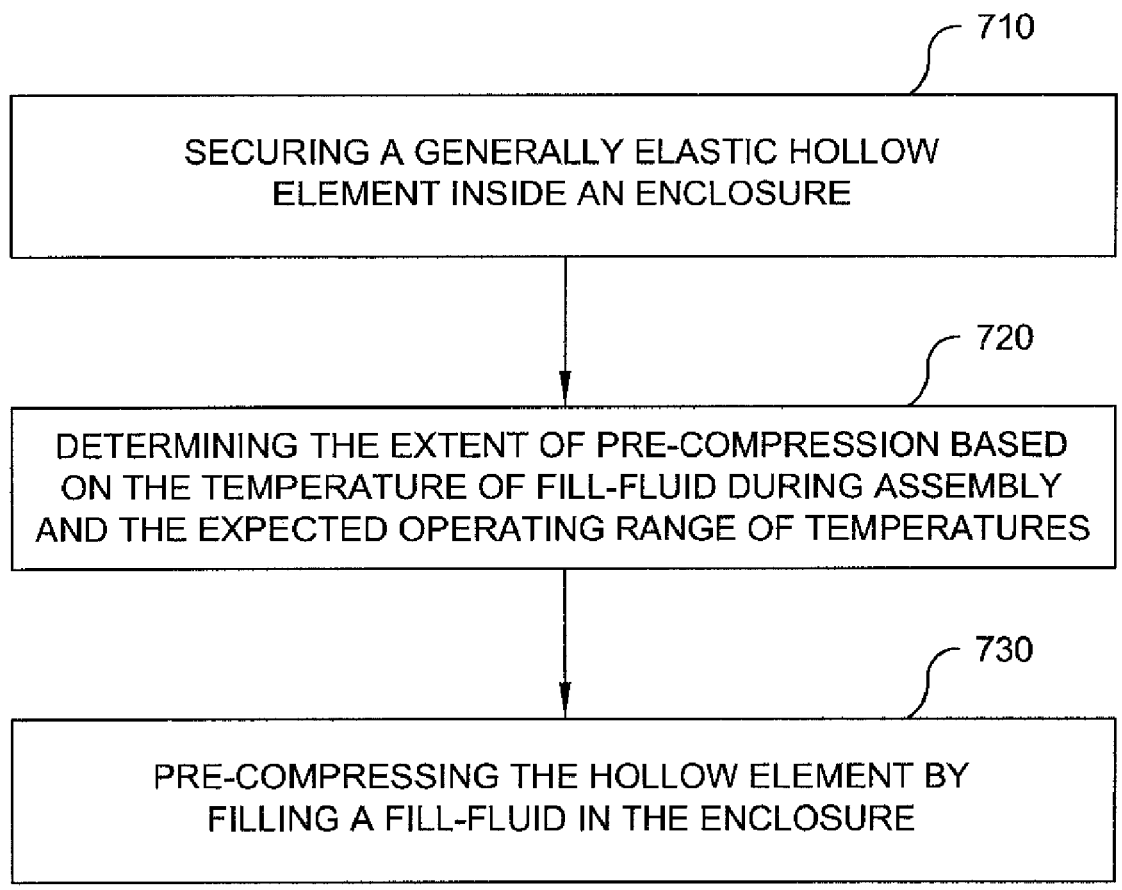
FIG. 7 is a flow-chart illustrating an exemplary process of pressure-compensating a fill-fluid enclosure.
Figure 8:
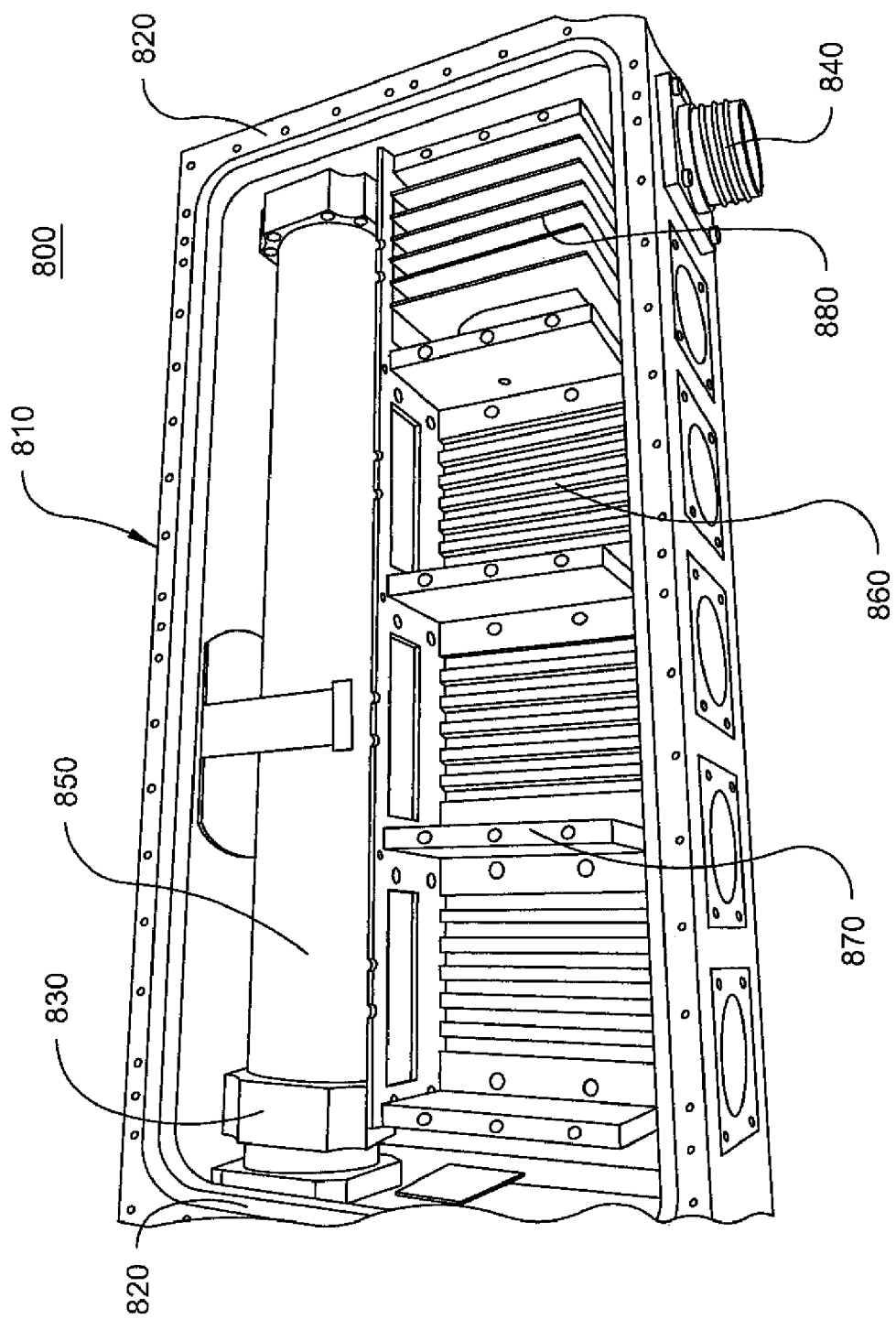
FIG. 8 illustrates a set up for testing a pressure-compensated enclosure according to an embodiment of the invention.

Referring now to FIG. 7 in conjunction with the exemplary embodiment shown in FIG. 8, there is provided a setup for the pressure-compensated enclosure 800 (FIG. 8), according to an exemplary embodiment of the present invention. The set up shown in FIG. 8 includes an open top view of a rectangular shaped enclosure 810, made of stainless steel. Enclosure 810 is approximately two (2) feet long, ten (10) inches wide and six (6) inches in height. Enclosure 810 is adapted to receive a removable top cover (not shown) and to be sealed (e.g. hermetically sealed) to prevent uncontained fluid entry into the cavity or interior of the enclosure. A pressure-compensating element 850 is fitted to two opposing walls 820. Element 850 is a nitrile rubber tube having a diameter of two (2) inches. Element 150 is fitted to oppositely disposed end walls 820 using o-rings (not shown) and metallic collars 830. End walls 820 have corresponding apertures therein, each of the apertures sealingly coupled to an end of tube 850 disposed in enclosure 810 so as to be in fluid communication with the environment outside enclosure 810 by means of tube 850. A frame 870 defines spaces 860 wherein components 880 to be protected, such as electronic circuit boards, are accommodated within the cavity of enclosure 810. A connector 840 enables circuit boards 880 to be electrically coupled to components external to enclosure 810. Spacer rods (not shown) in the form of plastic spacer rods (not shown) having a diameter of one-half inch may be inserted into element 150 during the assembly/calibration stage so as to collapse element 150 to a pre-determined extent. The number of spacer rods (not shown) is calculated using the initial fill fluid temperature and the expected operating temperature range.

Enclosure 810 is then closed using the top cover (not shown). Fill fluid is then pumped into enclosure 810 though a fitting (not shown) containing a check valve (not shown). A vent port (not shown) in enclosure 810 permits the air within enclosure 810 to escape while the fill fluid is being pumped into enclosure 810. The vent port (not shown) is then sealed with a vent plug (not shown) to prevent fill fluid escaping from enclosure 810. Additional fill fluid is pumped into enclosure 810 until element 850 is completely collapsed onto the temporary spacer rods (not shown) placed within element 850. Enclosure 810 is completely sealed so as to prevent ingress or egress of fluid to/from the external environment into the enclosure cavity, other than that within the tube.

Enclosure 810 was tested in a high-pressure environment and in a thermal chamber. Enclosure 810 was tested in a large pressure vessel filled with water, wherein enclosure 810 was subjected to numerous pressure cycles. A pressure resistant cable was connected to connector 840 to provide power and monitor the operation of circuit boards 880. Upon removal from the pressure chamber, enclosure 810 was subjected to a visual inspection to check for any pressure induced deformation of enclosure 810 and any leakage of either water into enclosure 810 or of fill fluid out of enclosure 810. Enclosure 810 was also tested in a thermal chamber wherein enclosure 810 was subjected to varying temperatures in the operating temperature range. During the heating cycle, the fill fluid expanded and element 850 collapsed to accommodate thermally induced volumetric changes in the fill fluid. Element 850, thus, absorbed the pressure exerted by these thermally induced volumetric changes in the fill fluid, thereby lessening the pressure exerted on the enclosure walls by the fill fluid. During the cooling cycle, as the fill fluid contracted, element 850 expanded towards its natural state, thereby preventing the creation of a vacuum within enclosure 810. Thus, there is disclosed a sealed enclosure 810 having substantially rigid outer walls and an interior cavity adapted to receive components to be protected by the enclosure. The sealed enclosure has apertures in its outer walls, which apertures are sealingly coupled to respective ends of a hollow, elastic tube 850 disposed in the enclosure so as to be in fluid communication with the environment exterior of the enclosure. An incompressible fluid substantially fills the sealed enclosure, wherein, in response to a change in pressure or temperature of the enclosure, the volume occupied by the incompressible fluid changes and the hollow elastic tube deforms responsive to the change in volume of the incompressible fluid sufficient to pressure balance the enclosure.

While the foregoing invention has been described with reference to the above-described embodiment, various modifications and changes can be made without departing from the spirit of the invention. Accordingly, all such modifications and changes are considered to be within the scope of the appended claims.

What is claimed is:

1. A pressure-compensated enclosure comprising:
   an enclosure filled with a substantially incompressible fluid; and
   a generally elastic hollow element securedly positioned inside said enclosure, said hollow element having a first port opening outside said enclosure,
   wherein said generally elastic hollow element is at least partially collapsed in a first state, and wherein, responsive to an expansion of said substantially incompressible fluid against an outer surface of said hollow element, said hollow element further collapses relative to said first state, and responsive to a contraction of said substantially incompressible fluid, said hollow element expands.

2. The enclosure of claim 1, wherein said generally elastic hollow element is a generally tubular member further comprising a second port opening outside said enclosure.

3. The enclosure of claim 2, wherein said generally tubular member is made of an elastic polymeric material.

4. The enclosure of claim 1, said generally elastic hollow element is removably positioned inside said enclosure.

5. The enclosure of claim 1, wherein said generally elastic hollow element is replaceably positioned inside said enclosure.

6. The enclosure of claim 1, wherein said generally elastic hollow element has a circular cross-section.

7. The enclosure of claim 1, wherein said generally elastic hollow element has an oval cross-section.

8. The enclosure of claim 1, wherein said generally elastic hollow element comprises a plurality of generally elastic hollow elements, wherein each of said plurality of elastic hollow elements has a port opening outside the enclosure.

9. The enclosure of claim 8, wherein said plurality of generally elastic hollow elements comprise a plurality of generally tubular members.

10. The enclosure of claim 1, wherein said substantially incompressible fluid comprises a mixture of two or more fluids.

11. A method for pressure-compensating an enclosure containing components to be protected, said method comprising the steps of:
   securing a generally elastic hollow element inside said enclosure such that said elastic hollow element has at least one port opening outside said enclosure; and
   pre-collapsing said generally elastic hollow element from its initial natural state by filling said enclosure with a substantially incompressible fluid,
   wherein the extent of pre-collapsing is determined according to the temperature of said fluid and the range of operating temperatures.

12. The method of claim 11, further comprising securing said generally elastic hollow element inside said enclosure such that said hollow element has two ports opening outside said enclosure.

13. The method of claim 11, wherein said components to be protected include electronic components.

14. The method of claim 11, further comprising submersing said enclosure into a fluid environment causing a change in at least one of pressure and temperature.

15. A pressure compensating enclosure comprising:
   a sealed enclosure having substantially rigid outer walls and an interior cavity adapted to receive components to be protected by said enclosure;
   said sealed enclosure having an aperture in one of said walls which is sealingly coupled to a hollow, elastic member disposed in said enclosure so as to be in fluid communication with the exterior of said enclosure; and
   an incompressible fluid substantially filling said sealed enclosure, wherein in response to a change in temperature of said enclosure, the volume occupied by said incompressible fluid changes and the hollow elastic member deforms responsive to said change in volume of said incompressible fluid sufficient to pressure balance said enclosure.

16. The enclosure of claim 15, wherein said elastic hollow member is a tube having a first end and a second end, the first end sealingly coupled to said aperture, and a second end sealingly coupled to a second aperture in one of the walls of said sealed enclosure so as to be in fluid communication with the exterior of said enclosure.

17. The enclosure of claim 16, wherein said flexible tube is adapted to be partially collapsed at a reference temperature, and wherein said enclosure is subjected to temperatures that vary from said reference temperature within a given range of operating temperatures of said fill fluid.

18. The enclosure of claim 16, wherein said incompressible fluid is an oil.

19. The enclosure of claim 16, wherein said components to be protected by said enclosure include electronic components.

20. The enclosure of claim 19, wherein said electronic components include printed circuit boards.

* * * * *

UNITED STATES PATENT AND TRADEMARK OFFICE
CERTIFICATE OF CORRECTION

| | | |
|---|---|---|
| PATENT NO. | : 8,072,776 B2 | Page 1 of 1 |
| APPLICATION NO. | : 12/271569 | |
| DATED | : December 6, 2011 | |
| INVENTOR(S) | : Donald L. Levine | |

It is certified that error appears in the above-identified patent and that said Letters Patent is hereby corrected as shown below:

In Column 1, line 3 please insert the following:

-- GOVERNMENTAL INTEREST

This invention was made with Government support under Contract DAAB-07-03-D-B009 awarded by the Department of the Navy. --

Signed and Sealed this
Fifteenth Day of January, 2013

David J. Kappos
*Director of the United States Patent and Trademark Office*